(12) United States Patent
Wagner

(10) Patent No.: US 6,769,175 B2
(45) Date of Patent: Aug. 3, 2004

(54) HEAT SINK DEVICE MANUFACTURE

(75) Inventor: Guy R Wagner, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 245 days.

(21) Appl. No.: 10/060,796

(22) Filed: Jan. 30, 2002

(65) Prior Publication Data

US 2002/0162647 A1 Nov. 7, 2002

Related U.S. Application Data

(60) Provisional application No. 60/287,847, filed on May 1, 2001.

(51) Int. Cl.[7] ................................................ B23P 15/00
(52) U.S. Cl. .................... 29/890.03; 29/557; 29/558; 165/80.3
(58) Field of Search .............................. 29/890.03, 557, 29/558; 165/80.3, 121, 122, 123, 124; 361/695, 697; 257/721, 722

(56) References Cited

U.S. PATENT DOCUMENTS

| | | | |
|---|---|---|---|
| 5,740,013 A | * | 4/1998 | Roesner et al. ............. 361/697 |
| 5,785,116 A | | 7/1998 | Wagner |
| 5,975,194 A | | 11/1999 | Wagner |
| 6,134,108 A | | 10/2000 | Patel et al. |
| 6,152,214 A | | 11/2000 | Wagner |
| 6,157,539 A | * | 12/2000 | Wagner ...................... 165/80.3 |
| 6,176,299 B1 | * | 1/2001 | Hanzlik et al. ............. 165/80.3 |
| 6,360,816 B1 | * | 3/2002 | Wagner ...................... 165/122 |
| 6,401,808 B1 | * | 6/2002 | Hanzlik et al. .............. 165/121 |

* cited by examiner

Primary Examiner—I Cuda Rosenbaum

(57) ABSTRACT

A method for manufacturing a cooling device. The cooling device may be used to cool an integrated circuit. The method is broadly summarized by the following steps: pressing a metal slug to near-net shape, wherein the near-net shape includes a peripheral wall portion defining a chamber, the chamber having a first open end and a second closed end, the closed end defined by a chamber floor portion, and wherein the near-net shape includes a heat conductive base portion, the heat conductive base portion being defined by a lower base surface and the chamber floor portion; machining the lower base surface; creating a radius on the top of the peripheral wall portion; and cutting a plurality of slot openings in the peripheral wall portion.

12 Claims, 8 Drawing Sheets

HEAT SINK DEVICE MANUFACTURE

CROSS-REFERENCE TO RELATED APPLICATION

This application claims priority to copending U.S. provisional application entitled, "Heat Sink Device Manufacture," having Ser. No. 60/287,847, filed May 1, 2001, which is entirely incorporated herein by reference.

TECHNICAL FIELD

The present invention is generally related to the manufacture of cooling devices and, more particularly, is related to a system and method for the manufacture of integrated circuit cooling devices.

BACKGROUND OF THE INVENTION

Integrated circuit devices are increasingly being used in modem electronic applications. One prevalent example is the computer. The central processing unit of most computers is constructed from an integrated circuit device.

During normal operation, integrated circuit devices generate significant amounts of heat. If this heat is not continuously removed, the integrated circuit device may overheat, resulting in damage to the device and/or a reduction in operating performance. In order to avoid such overheating, integrated circuit cooling devices are often used in conjunction with integrated circuit devices.

One such cooling device is a fan assisted heat sink cooling device. In such a device, a heat sink is formed of a material, such as aluminum, which readily conducts heat. The heat sink is usually placed on top of, and in contact with, the integrated circuit device. Due to this contact, heat generated by the integrated circuit is conducted into the heat sink and away from the integrated circuit.

The heat sink may include a plurality of cooling fins in order to increase the surface area of the heat sink and, thus, maximize the transfer of heat from the heat sink device into the surrounding air. In this manner, the heat sink draws heat away from the integrated circuit and transfers the heat into the surrounding air.

In order to enhance the cooling capacity of such a heat sink device, an electrically powered fan is often mounted on top of the heat sink. In operation, the fan causes air to move over and around the fins of the heat sink device, thus cooling the fins by enhancing the transfer of heat from the fins into the ambient air.

Over the years, as the power of integrated circuit devices has increased, so has the amount of heat generated by these devices. In order to adequately cool these higher-powered integrated circuit devices, integrated circuit cooling devices with greater cooling capacities are required.

One approach to achieving greater cooling capacity is to increase the size of the integrated circuit cooling devices. Specifically, cooling devices have been made larger by the incorporation of larger heat sinks and larger fans. This increase in size, however, has been found to present a problem. Increasing the size of the cooling device in a vertical direction (i.e. in a direction perpendicular to the orientation of the integrated circuit board) is often a problem because of the limited envelope available in many applications, such as in the computer case of a desktop personal computer. In most situations, a fairly substantial clearance area is required between the fan opening and the computer case to allow adequate airflow into or out of the fan.

Increasing the size of the cooling device in a horizontal direction (i.e. in a direction parallel to the orientation of the integrated circuit board) is also often a problem because this limits the number of integrated circuit devices (and other electronic devices) which may be incorporated into the computer case.

Another problem with fan assisted heat sink cooling devices is the noise generated by the fans, particularly in situations where larger fans are used to achieve increased cooling capacity. This is particularly a problem in desktop computers where a user is commonly in close proximity to the machine. The problem is further aggravated in situations where multiple integrated circuit devices, and, thus, multiple cooling devices, are mounted in the same computer case, as occurs in many high power computers.

The size and noise problems associated with heat sink devices were addressed in U.S. Pat. Nos. 5,785,116 and 5,975,194, both entitled "Fan Assisted Heat Sink Device," issued to Wagner on Jul. 28, 1998 and Nov. 2, 1999 respectively; and a method for cooling was addressed in U.S. Pat. No. 6,152,214 entitled "Cooling Device and Method," issued to Wagner on Nov. 28, 2000. Additional heat sink devices were disclosed in U.S. Pat. No. 6,134,108 entitled "Apparatus and Method for Air-Cooling an Electronic Assembly." The '116 and '194 Patents describe various embodiments of devices that may be collectively referred to as the "Wagner device." The '116, '194 and '108 Patents are entirely incorporated herein by reference. The Wagner device has a heat sink assembly that also forms the housing surrounding the fan. In this manner, the vertical size of the cooling device is minimized. The housing is constructed of a plurality of cooling vanes that have elongated openings therebetween allowing air to pass between and cool the vanes.

The Wagner device is also designed to generate significantly less noise while operating. To accomplish this, the cooling vanes may be angled in an approximately opposite manner to the angle of the fan blades. It has been found that this configuration significantly reduces the noise generated by the cooling device.

The configuration of the Wagner device causes it to operate in an efficient manner. Because the fan housing is constructed from a series of vanes, air is caused to enter the housing through the housing wall as well as from the open top of the housing. Accordingly, the cooling device is able to operate with a much smaller overhead clearance. Also, air being exhausted from the cooling device is caused to pass over the housing vanes a second time, thus further enhancing heat dissipation.

Air is exhausted from the housing of the Wagner device through a series of curved slots that are aligned to match the direction of airflow from the fan blades. This arrangement results in a highly efficient air flow path for increased cooling device efficiency.

The Wagner device includes an assembly that may be integrally formed to prevent heat conductance losses ordinarily associated with joints. A large mass of heat conductive material is provided in the base of the heat sink assembly immediately adjacent the integrated circuit device to enhance heat flow from the integrated circuit device into the heat sink.

Despite the advancements in the field, including those of the Wagner device described above, adoption of the heat sink devices have failed to reach their full potential due to the high cost of manufacturing the device. The Wagner device may be manufactured using the following steps.

First, an extruded solid round bar may be provided having substantially the same diameter as the outside diameter of the heat sink assembly. The solid round bar is generally a metal. The metal may be, but is not limited to, aluminum.

The cylinder may then be machined, e.g. with a lathe, to the exact outside diameter of the heat sink assembly. A lathe may then be used to form a fan chamber. The fan chamber has a diameter and a counterbore. The counterbore having a diameter less than the diameter of the chamber.

An end milling operation may then be used to form a notch in the floor of the fan chamber. Openings in the fan chamber walls may then be formed using a circular slitting saw. After the slitting saw is oriented at the desired opening inclination angle and rotation angle, successive openings may be cut, with the heat sink assembly being rotated an appropriate distance relative to the slitting saw between each cut.

A cylinder having a height substantially equal to the heat sink base plate thickness is then cut from the bar. After cutting the cylinder, the heat sink assembly lower surface may be milled or turned flat and smooth to facilitate reliable attachment to a heat source. Optionally, bores and threaded openings may be machined into the lower surface to facilitate attachment.

Unfortunately, the amount of machining required to produce the heat sink assembly has made large-scale production cost prohibitive. Thus, an unaddressed need exists in the industry to address the aforementioned deficiencies and inadequacies.

SUMMARY OF THE INVENTION

The present invention provides a method for manufacturing a cooling device. In this regard, one embodiment of the method can be broadly summarized by the following steps: (1) accepting a metal slug; (2) pressing the metal slug to near-net shape, wherein the near-net shape includes a peripheral wall portion defining a chamber, the chamber having a first open end and a second closed end, the closed end defined by a chamber floor portion, and wherein the near-net shape includes a heat conductive base portion, the heat conductive base portion being defined by a lower base surface and the chamber floor portion; (3) machining the lower base surface; (4) creating a radius on the top of the peripheral wall portion; and (5) cutting a plurality of slot openings in the peripheral wall portion.

The present invention may also be viewed as a cooling device manufactured in accordance with a method of manufacturing such as the method described above. Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
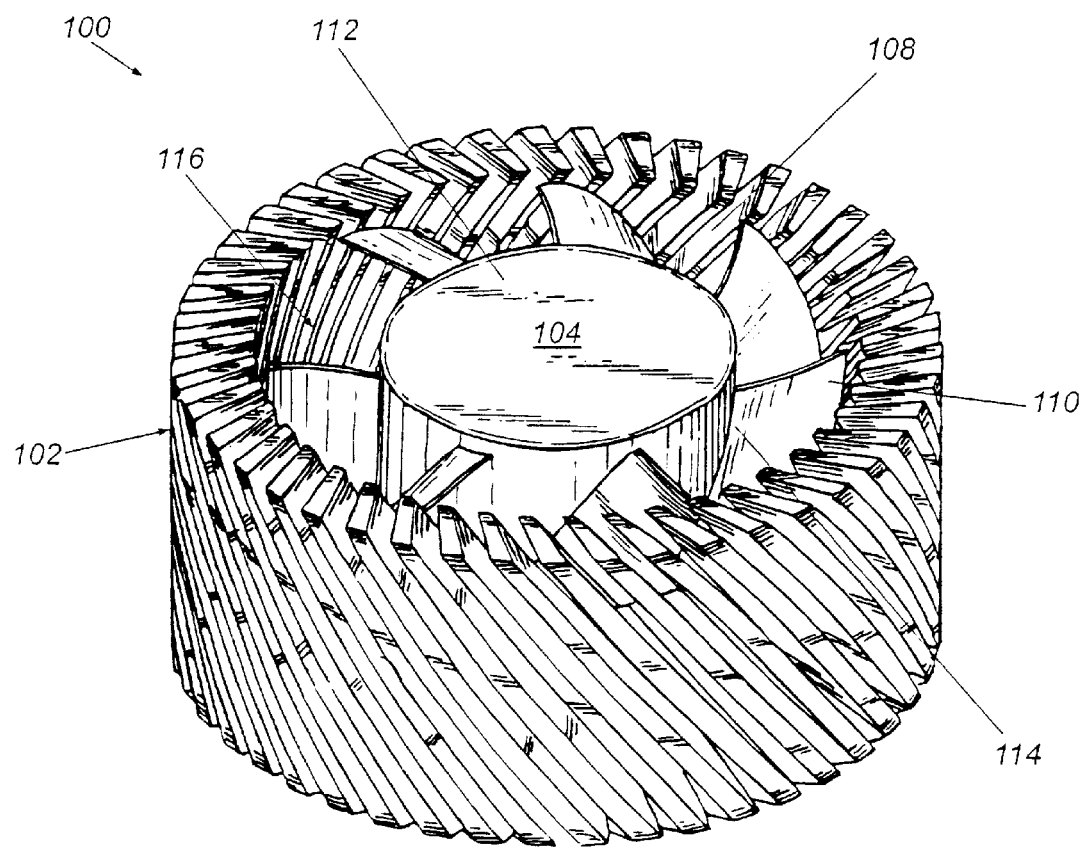
FIG. 1 is a front perspective view of a cooling device including a heat sink assembly.
Figure 2:
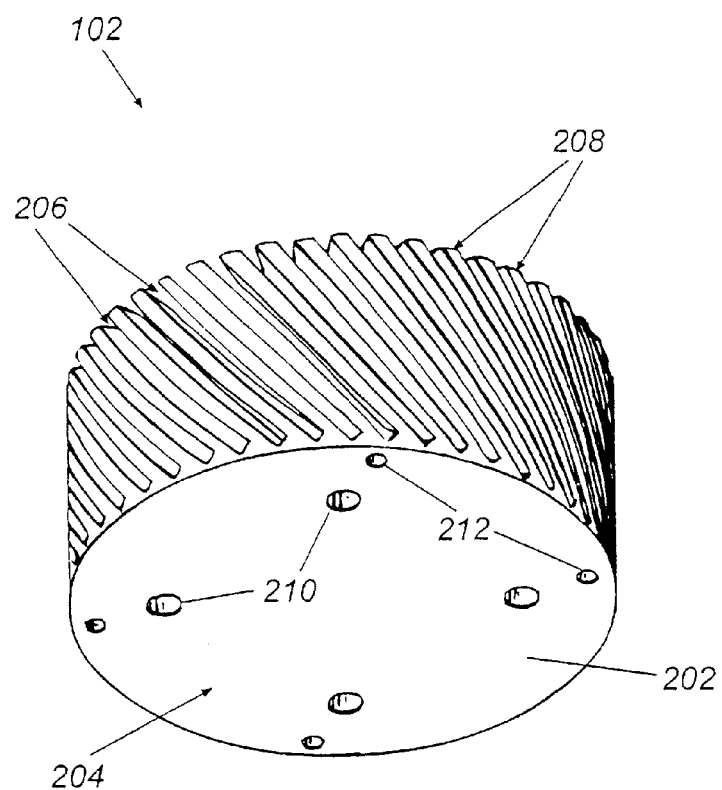
FIG. 2 is a bottom perspective view of the heat sink assembly of FIG. 1.
Figure 3:
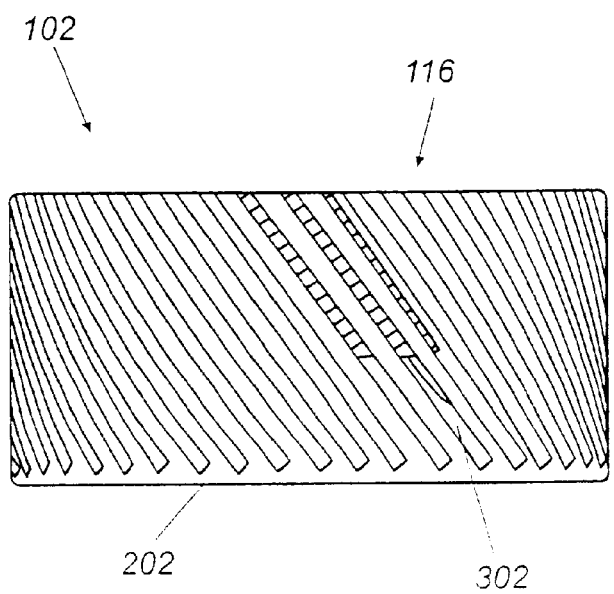
FIG. 3 is a side elevation view of the heat sink assembly of FIG. 1.
Figure 4:
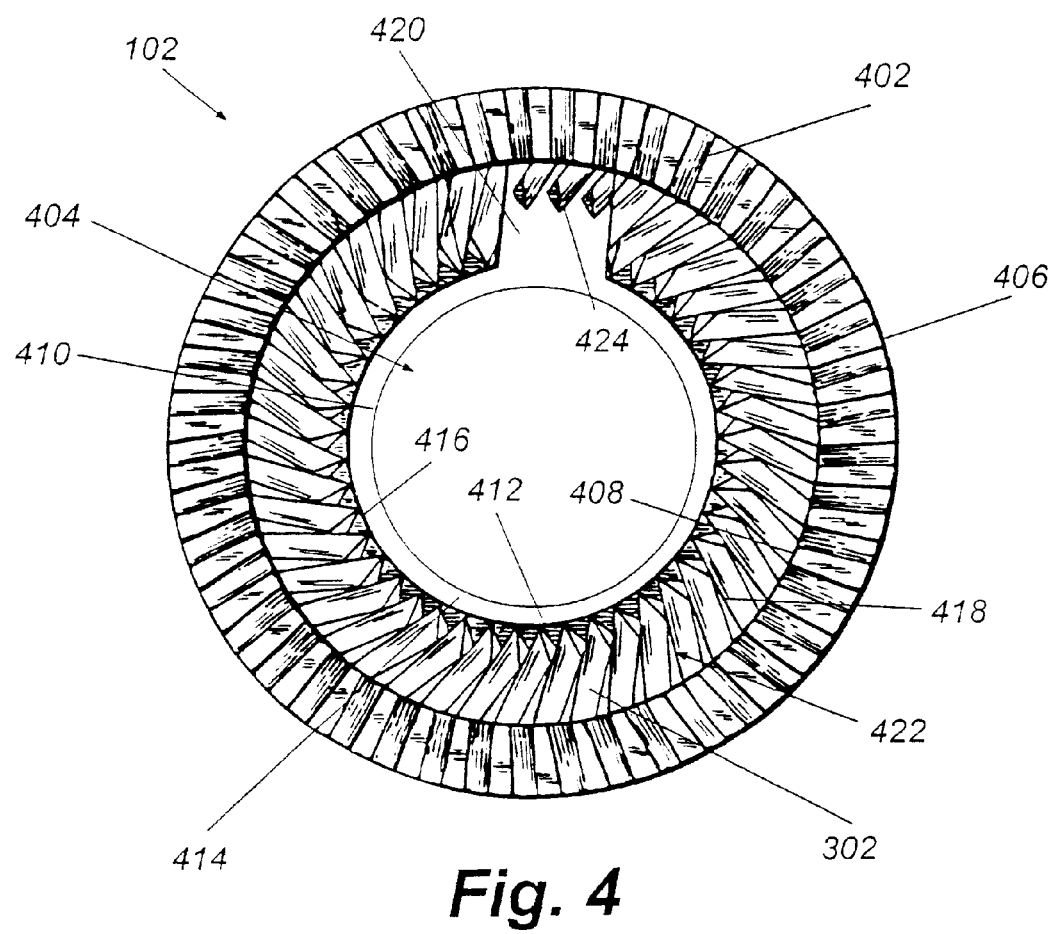
FIG. 4 is a top plan view of the heat sink assembly of FIG. 1.

FIGS. 1–5, in general, illustrate a cooling device 100 (FIG. 1) for dissipating heat from a heat source 502 (FIG. 5) such as an integrated circuit. The cooling device 100 (FIG. 1) may include a heat sink assembly 102 (FIG. 1) having a lower substantially planar base surface 202 (FIG. 2) adapted to contact the heat source 502 (FIG. 5) and a peripheral annular wall portion 402 (FIG. 4) which defines a fan chamber 108 (FIG. 1). The fan chamber 108 (FIG. 1) may be designed to accept a fan assembly 104 (FIG. 1). The fan chamber 108 (FIG. 1) may have a first open end 1 16 (FIG. 1) and a second closed end defined by a chamber floor portion 404 (FIG. 4). The cooling device 100 (FIG. 1) may also include a heat conductive base portion 204 (FIG. 2) located between the lower planar base surface 202 (FIG. 2) and the chamber floor portion 404 (FIG. 4). A plurality of slot openings 206 (FIG. 2) extend through the peripheral annular wall portion 402 (FIG. 4) and also into the base portion 204 (FIG. 2).

FIGS. 1–5 also illustrate, in general, a cooling device 100 (FIG. 1) for dissipating heat from a heat source 502 (FIG. 5), the cooling device 100 (FIG. 1) including a fan chamber 108 (FIG. 1) defined by a plurality of cooling vanes 208 (FIG. 2), and the cooling device 100 (FIG. 1) including a plurality of fan blades 110 (FIG. 1) associated with a fan assembly 104 (FIG. 1) within the fan chamber 108 (FIG. 1).

Figure 5:
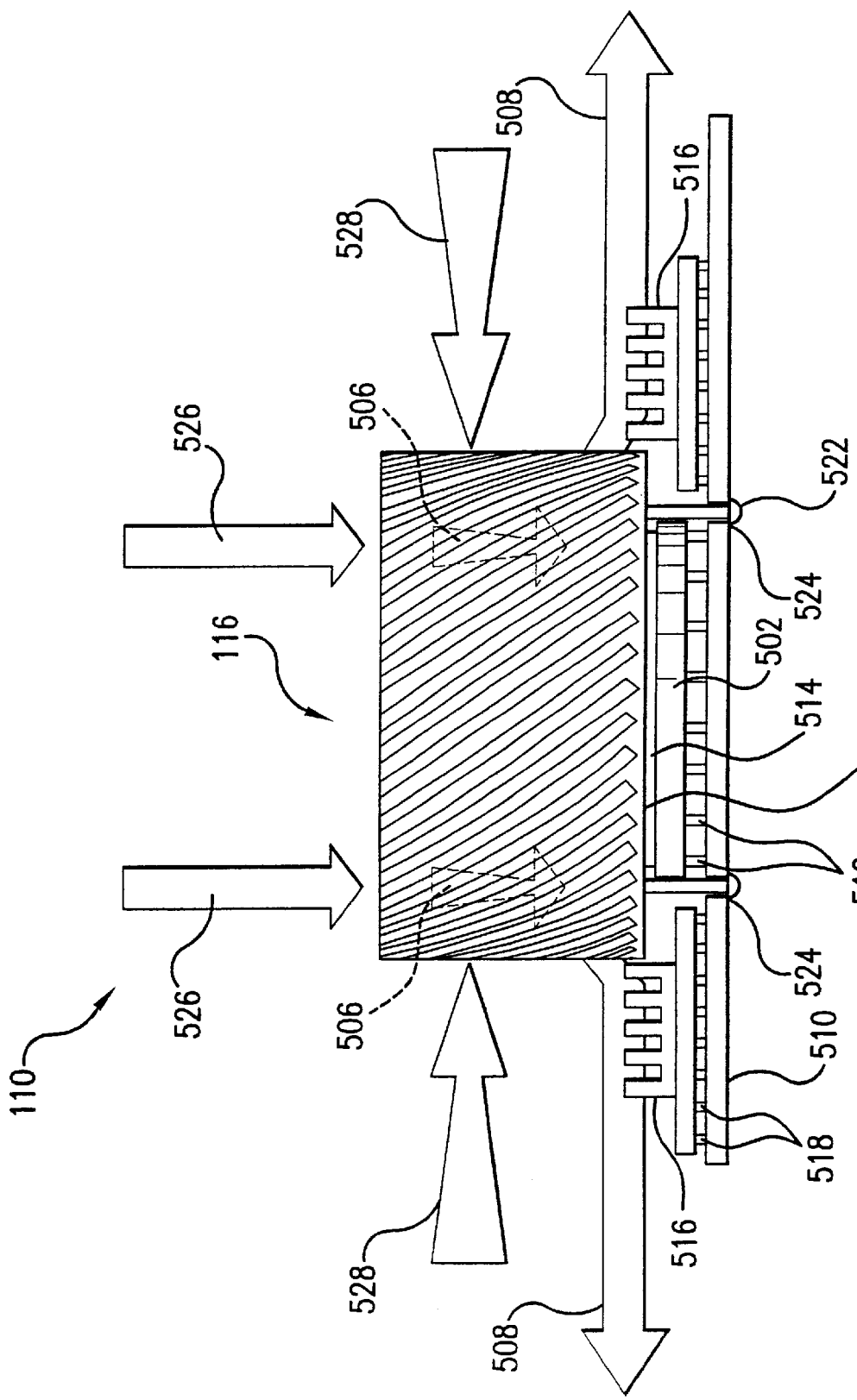
FIG. 5 is a front elevation view of the cooling device of FIG. 1 mounted on an integrated circuit board.
Figure 6:
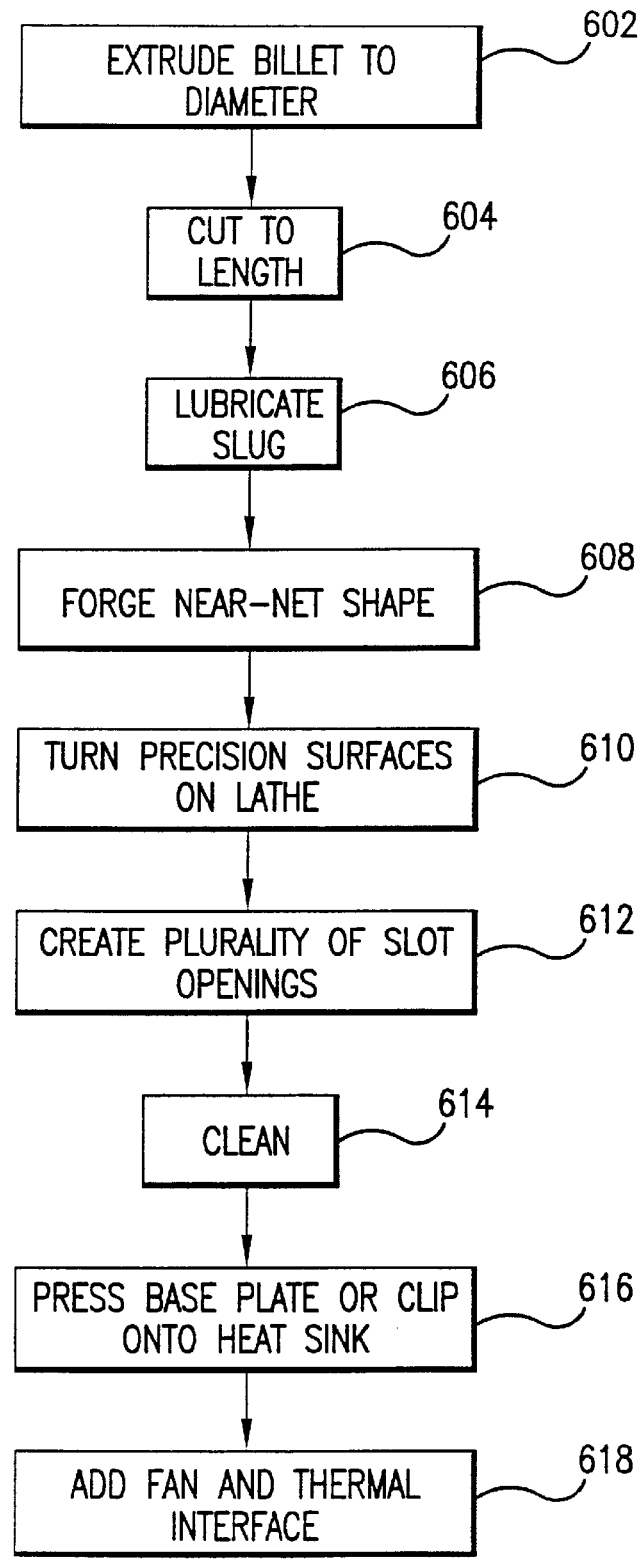
FIG. 6 is a flowchart showing the steps included in manufacturing the cooling device of FIG. 1.

FIG. 6 illustrates a flowchart 600 showing an embodiment of steps that may be included in manufacturing the cooling device 100 (FIG. 1) illustrated in FIGS. 1–5. The steps may include an extruding step 602, a first cutting step 604, a lubricating step 606, a forging step 608, a turning step 610, a second cutting step 612, a cleaning step 614, a pressing step 616, and an adding step 618.

FIGS. 7–12, in general, illustrate the state of the cooling device 100 (FIG. 1) during some of the steps shown in flowchart 600 for manufacturing the cooling device 100.

Having thus described the heat sink device manufacture in general, the manufacture will now be described in further detail. FIG. 1 is a front perspective view of a cooling device 100 including a heat sink assembly 102. A fan assembly 104 is mounted in the heat sink assembly 102. The fan assembly 104 includes a plurality of fan blades 110. The plurality of fan blades 110 may be mounted on a hub assembly 112 which may, in turn, be rotatably mounted on a shaft (not shown) of a fan base member (not shown). Hub assembly 112 may be rotatably driven with respect to the shaft by a motor (not shown) located within the hub assembly 112. Fan assembly 104 has a central longitudinal axis. The hub assembly 112 rotates about the longitudinal axis when the fan assembly 104 is activated. Electrical wires 1202 (FIG. 12) may enter the fan assembly 104 through slot openings 206 (FIG. 2) in order to supply electric power to the fan assembly 104 motor. The electrical wires 1202 (FIG. 12) may include two wires for powering the fan assembly 104 motor. A third wire may optionally be included in the electrical wires 1202 (FIG. 12) and connected to the fan assembly 104 in order to monitor and/or control fan rotation. In this manner, the heat source 502 (FIG. 5) being cooled by the cooling device 100 may be shut down if the fan assembly 104 fails to rotate at a specified speed, thus preventing overheating of the heat source 502 (FIG. 5). Additionally, the fan assembly 104 may be controlled to vary the fan rotation based on the cooling needs of the heat source 502 (FIG. 5).

The fan assembly 104 motor may be a 12-volt DC brushless motor. The fan assembly 104 may be of the type commercially available from Matsushita Electric Company of Japan, sold as Model FBA06A12H and under the trade name "PANAFLO" (with its housing removed).

One embodiment of the heat sink assembly 102, as shown in FIGS. 1–5, has a peripheral annular wall portion 402 (FIG. 4) with a generally square upper portion. In another embodiment, shown in FIGS. 6–12, the heat sink assembly 102 has a radius 902 formed on the top of the peripheral annular wall portion 402 (FIG. 4).

Heat sink assembly 102 is shown in further detail in FIGS. 2–4. Heat sink assembly 102 may be of a generally cylindrical shape. The heat sink assembly 102 may be formed from any heat conductive material. The heat conductive material may be a high thermal conductivity material, such as aluminum or copper, to ensure that heat travels readily from the heat source 502 (FIG. 5).

Heat sink assembly 102 includes the heat conducting base portion 204 having a lower planar base surface 202. Heat sink assembly 102 base portion 204 may have a diameter that is equal to the diameter of the heat sink assembly 102. Lower planar base surface 202 may contain a plurality of bores 210. The bores 210 may allow clearance for projections that sometimes exist on electronic components such as the heat source 502 (FIG. 5). A plurality of threaded openings 212 may also be provided in lower planar base surface 202.

Extending up from the base portion 204 is the peripheral annular wall portion 402. Peripheral annular wall portion 402 has an outer surface 406 and an inner surface 408. Outer surface 406 forms part of the outer surface of the heat sink assembly 102.

The generally cylindrically shaped fan chamber 108 is located within the peripheral annular wall portion 402, with the outer wall of the fan chamber 108 being defined by the peripheral annular wall portion 402 inner surface 408. The upper end of fan chamber 108 has an open end 116. The lower end of fan chamber 108 may be defined by a chamber floor portion 404. The chamber floor portion 404 may include a chamber center floor 410, a stepped wall 412, a stepped surface 414, an upwardly extending circumferential wall 416, a lower slotted surface 418, and a notch 420.

The outer periphery of heat sink assembly 102 includes the plurality of slot openings 206. As may be seen in FIG. 4, the plurality of slot openings 206 extend through the peripheral annular wall portion 402. The plurality of cooling vanes 208 are defined by the slot openings 206, such that there is a cooling vane 208 located between every two slot openings 206 around the peripheral annular wall portion 402. The plurality of slot openings 206 open into the fan chamber 108 and allow air to move between the outside of the heat sink assembly 102 and the fan chamber 108 through the peripheral annular wall portion 402. The plurality of slot openings 206 and the plurality of cooling vanes 208 also extend below the peripheral annular wall portion 402 and into the heat conductive base portion 204.

The configuration of the cooling vanes 208 making up the peripheral annular wall portion 402 will now be described in detail. The size of the individual cooling vanes 208 depends upon the number of cooling vanes 208 forming the peripheral annular wall portion 402 and upon the width of the slot openings 206. Although the drawing figures show a specific number of cooling vanes 208 and slot openings 206 for illustration purposes, any number of cooling vanes 208 and slot openings 206 may be used in the cooling device 100.

One embodiment that provides efficient air flow and heat transfer has 45 cooling vanes and 45 openings. In this embodiment, the cooling vanes 208, at the outer surface 406 of the peripheral annular wall portion 402 may have a thickness of about 2.2 mm, measured in a direction normal to the cooling vane 208 inclination. Each cooling vane 208 may taper to a thickness of about 1.35 mm at the inner surface 408 of the peripheral annular wall portion 402, measured in a direction normal to the cooling vane 208 inclination.

Because the cooling vanes 208 taper toward the inner surface 408 of peripheral annular wall portion 402, the slot openings 206 may be formed having a relatively constant width across the peripheral annular wall portion 402. This constant width provides for efficient airflow through the slot openings 206 between the exterior of cooling device 100 and the fan chamber 108. The slot openings 206 may have a thickness of approximately 2 mm.

FIG. 4 is a top plan view of the heat sink assembly 102 of FIG. 1. FIG. 4 shows the slot openings 206 extending below the peripheral annular wall portion 402 and into the heat conductive base portion 204. The slot openings 206 in the base portion 204 define upwardly facing openings 422 in the fan chamber 108 lower slotted surface 418. The bottom portions of the slot openings 206 terminate in curved surface portions 302 (FIG. 3). The curved surface portions 302 cause the airflow through the cooling device 100 to change from a vertical airflow path 506 (FIG. 5) to a horizontal exhaust flow path 508 (FIG. 5) as will be described in further detail with reference to FIG. 5. The provision of curved surfaces, such as the curved surface portions 302, allows for a smooth, energy efficient transition from the vertical airflow path 506 to the horizontal exhaust airflow path 508 and, thus, contributes to the overall efficiency of the cooling device 100.

When the fan assembly 104 is inserted into the heat sink assembly 102, the fan assembly 104 base member (not shown) fits within the circumferential wall 416. To securely fasten the fan assembly 104 to the heat sink assembly 102, a conventional adhesive may be applied to either the lower surface (not shown) of the fan assembly 104 base member or to the stepped surface 414 of the heat sink assembly 102, or to both. In this manner, the fan assembly 104 base member may be securely fastened within the fan chamber 108 while allowing the plurality of fan blades 110 to rotate freely within the fan chamber 108. Fastening the fan assembly 104 to the heat sink at the stepped surface 414 allows for an air cavity to be formed under the fan assembly 104. The air cavity insulates the fan assembly 104 from the chamber floor portion 404. Alternatively, the fan assembly 104 may be secured within the heat sink assembly 102 in any conventional manner.

The notch 420 may be provided in the heat sink assembly 102 chamber floor portion 404 to allow clearance for the connection between the electrical wires 1202 (FIG. 12) and the fan base member when the fan assembly 104 is inserted into the heat sink assembly 102 as described above. The electrical wires 1202 (FIG. 12) may be passed through slot openings 206 in the heat conducting base portion 204, such as notch openings 424 in order to connect with a power source (not shown) located outside of the heat sink assembly 102.

When the fan assembly 104 is inserted into the heat sink assembly 102 as described above, a fan swept space 114 is entirely located within the heat sink assembly 102 fan chamber 108. Accordingly, the heat sink assembly 102 peripheral annular wall portion 402 completely surrounds the fan swept space 114. The peripheral annular wall portion 402 acts as a heat transfer surface and as a housing for the fan assembly 104. This configuration allows cooling device 100 to be very compact and efficient.

FIG. 5 is a front elevation view of the cooling device of FIG. 1 mounted on an integrated circuit board. FIG. 5 illustrates the cooling device 100 mounted for use in a typical component cooling application. In the example shown, a heat source 502 is mounted on a PC board 510. Heat source 502 may be, for example, a processor such as a central processing unit for use in personal computer and workstation applications. As will be appreciated by those skilled in the art, heat source 502 can take many forms, including but not limited to other electrical heat generating devices such as power transistors, or mechanical or chemical heat sources. Heat source 502 may be mounted to the PC board 510 via electrical connectors 512 in a conventional manner. In order to facilitate heat dissipation, heat source 502 may be provided with a lid 514 that is formed from a heat conductive material such as copper in a conventional manner.

Auxiliary components 516 are often located in close proximity to primary components such as the heat source 502. Such auxiliary components 516 may be mounted to the PC Board 510 as shown by the auxiliary component connectors 518, or in any manner known to those having ordinary skill in the art.

During operation, electronic components, such as the heat source 502, and auxiliary components 516 generate significant amounts of heat. This is particularly true with more powerful components such as many of the computer processors currently in use. In order to keep such components operating at peak efficiency and to avoid damage, overheating of the components must be avoided. To prevent such overheating, it is necessary to remove sufficient heat from the components during operation.

To remove heat from the primary component, the cooling device 100 may be mounted directly on top of the heat source 502 lid 514 so that the planar surface 202 of the heat sink assembly 102 base portion 204 is in contact with the upper surface of the lid 514, forming a joint 520. In this manner, heat generated by the heat source 502 may be conducted through the lid 514 and into the base portion 204 of the heat sink assembly 102. To facilitate heat transfer across joint 520, a heat conductive substance, such as a heat conductive grease, may be applied between lid 514 and the lower planar base surface 202 of the heat conducting base portion 204 in a conventional manner.

Heat sink assembly 102 may be securely fastened to the PC board 510 in many ways known to those having ordinary skill in the art, including, but not limited to, the use of threaded fasteners 522. The fasteners 522 pass through holes 524 in the PC board 510 and threadingly engage with threaded openings 212 in the heat sink assembly 102. Although any number, such as four, threaded fasteners may be used to secure the heat sink assembly 102 to the PC board 510, only two are shown in FIG. 5.

In this manner, the lower planar base surface 202 of the heat sink assembly 102 may be tightly secured against the upper surface of the component lid 514, thus facilitating heat transfer between the two surfaces. Accordingly, heat is drawn away from the heat source 502 and into the relatively large base portion 204 of the heat sink assembly 102. The heat is then further conducted upwardly into the plurality of cooling vanes 208.

In order to facilitate drawing heat away from the heat source 502, the heat sink assembly 102 may be provided with a large base portion 204. Base portion 204 may have a diameter substantially equal to the diameter of the heat sink assembly 102. Base portion 204 may also have a height of approximately 16 mm. This relatively large height provides a large mass of heat conductive material between the heat sink assembly 102 lower planar base surface 202 and the fan chamber 108 and thus acts as a large heatsink, thus facilitating the removal of heat away from the heat source 502. Given the exemplary dimensions previously discussed, the height of the base portion 204 may be about 45% of the total height of the heat sink assembly 102. For efficient heat transfer, the height of the base portion 204 may be at least 25% of the total height of the heat sink assembly 102.

For efficient cooling, the heat, after being transferred into the base portion 204, may be further transferred into the plurality of cooling vanes 208 and then into the surrounding air. The ability of a heat sink device, such as heat sink assembly 102, to transfer heat into the air depends, among other things, upon the amount of surface area of the heat sink device exposed to the surrounding air. The plurality of cooling vanes 208 facilitate such heat transfer by effectively increasing the surface area of the heat sink device 102.

In operation, fan assembly 104 may rotate in a counter-clockwise direction, as viewed, for example, in FIG. 1. Referring to FIG. 5, this counter-clockwise fan rotation will cause air movement in the general direction of arrows 506. Specifically, intake air from the exterior of cooling device 100 will enter the heat sink assembly 102 fan chamber 108 through the open end 116. This air movement is indicated by the arrows 526. After entering the fan chamber 108, the air moves downwardly, in a direction aligned with the arrows 506 through the fan swept space 114, toward the fan chamber floor portion 404. Continuing its downward movement, the air enters the lower portion of the slot openings 206 through upwardly facing openings 422, in the fan chamber 108 lower slotted surface 418. The air then travels down the lower portion of the slot openings 206 and exhausts from the cooling device 100 as indicated by the arrows 508. After exiting the cooling device 100, the horizontal exhaust airflow path 508 moves over and thus serves to cool auxiliary components 516, located adjacent the heat source 502.

As the air moves through the lower portion of the slot openings 206, as described above, it also moves between the lower portions of the associated cooling vanes 208, located in the base portion 204, thereby cooling the vanes 208 and removing heat from the heat sink assembly 102.

The vertical airflow 506 moving through the fan chamber 108, results in a Bernoulli effect as it passes the plurality of slot openings 206. This Bernoulli effect induces an additional intake airflow, as indicated by the arrows 528. The airflow 528 comprises air moving from the exterior of the cooling device 100, through the upper portion of the slot openings 206 and into the fan chamber 108. The airflow 528 then joins the airflow 526 to form the vertical airflow 506 previously described.

By using the Bernoulli effect, the cooling device 100 is able to cause more air movement through the cooling device 100 than might be possible with other configurations. Specifically, to provide for the Bernoulli effect described above, the peripheral annular wall portion 402 of the fan chamber 108 is provided with the plurality of slot openings 206. The movement of the vertical airflow 506 past the slot openings 206 causes the Bernoulli effect and thus results in the increased air movement previously described.

As the airflow 528 moves through the upper portion of the slot openings 206, as described above, it also moves between the upper portions of the associated cooling vanes 208, thereby providing additional cooling of the vanes 208, located in the peripheral annular wall portion 402, and removal of heat from the heat sink assembly 102.

As can be appreciated from the above description, each vane 208 of the cooling device 100 is cooled by two separate airflows. First, airflow 528 moves past an upper portion of the vanes 208 to cool the vanes 208. Thereafter, the horizontal exhaust airflow 508 moves past a lower portion of the vanes 208 to further cool the vanes. Accordingly, a portion of the air moving through the cooling device 100 is used twice for cooling; once on intake making up the airflow 528 and a second time on exhaust partially making up the airflow 508.

As described above, the cooling device 100 is able to obtain intake air from the open end 116 of the fan chamber 108 and from the slot openings 206 surrounding the fan chamber 108. Because the cooling device 100 does not rely solely on the fan chamber open end 116 for intake air, the clearance provided above the cooling device 100 is less critical than with other designs. Cooling device 100 may operate efficiently with a clearance of as little as 2 mm above the open end 116. The ability to operate in low clearance applications is an advantageous feature that allows the cooling device 100 to be used in space sensitive applications and, particularly, in applications where the dimension normal to the orientation of the PC board 510 is limited.

Specifically, the cooling device 100, constructed according to the exemplary dimensions previously described, has a measured thermal resistance of about 0.35 degrees C. per watt with infinite clearance above the open end 116. In a conventional manner, this thermal resistance was measured as the difference between the temperature of the lower planar base surface 202 and the ambient air divided by the watts of heat energy being produced by the heat source (e.g., heat source 502). When a solid plate is placed approximately 2 mm above the open end 116, the measured thermal resistance of the cooling device 100 degrades only to about 0.38 degrees C. per watt. Accordingly, it can be appreciated that the thermal resistance of the cooling device 100 drops only about 9% when the vertical clearance above the open end 116 is reduced to about 2 mm.

Further details regarding such cooling devices may be found in U.S. Pat. No. 5,785,116 entitled "Fan Assisted Heat Sink Device," issued to Wagner on Jul. 28, 1998 which is entirely incorporated herein by reference.

A new cooling device 100 manufacturing process is shown in FIGS. 6–12. FIG. 6 shows a flowchart 600 illustrating the steps that may be included in the new manufacturing process. The new process may include: an extruding step 602 where a metal billet is extruded to a cylindrical shape; a first cutting step 604 where the cylindrical shape is cut to length resulting in a slug 700 (FIG. 7); a lubricating step 606 where the slug 700 is lubricated; a forging step 608 where the slug 700 is forged to a near-net shape; a turning step 610 where precision surfaces of the near-net shape are turned; a second cutting step 612 where fins are cut in the turned near-net shape by creating a plurality of slot openings 206 to form a heat sink assembly 102; a cleaning step 614 where the heat sink assembly 102 is cleaned; a pressing step 616 where a baseplate 1102 (FIG. 11) is pressed onto the heat sink assembly 102; and an adding step 618 where the fan assembly 104 and thermal interface are added.

In the extruding step 602, a solid bar of aluminum or other material, is extruded to a diameter that is less than the diameter of the heat sink assembly 102 conductive base portion 204.

Figure 7:
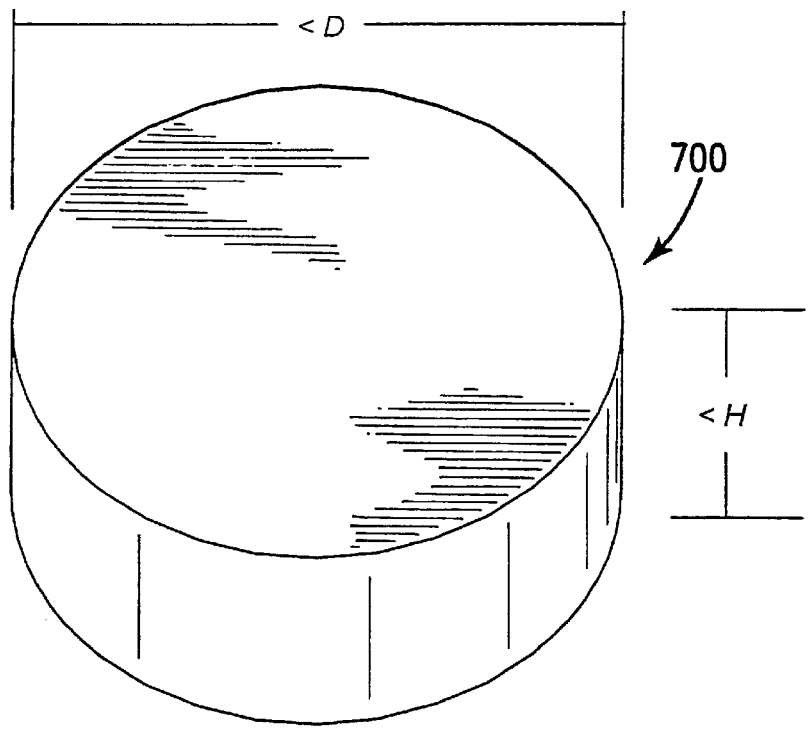
FIG. 7 is a front perspective view of a slug from which the heat sink assembly of FIG. 1 is formed.

In the first cutting step 604, the extruded solid round bar is cut to length. The length is less than the height of the peripheral annular wall portion 402. FIG. 7 is a front perspective view of a slug 700 from which the heat sink assembly 102 of FIG. 1 may be formed. The cut of step 602 is calculated to lead to a slug 700, with a weight that is slightly greater than the weight of the heat sink assembly 102. Slugs of too great a weight may damage forging equipment in later steps. Therefore, during initial runs of the manufacturing process, slugs may be cut to slightly less than the calculated weight in order to assure the slug is not so heavy as to damage the forging equipment. An ideal slug weight results in a slight overflow of material and the creation of a small lip 802 (FIG. 8) or flashing. The result of the cutting 604 step is a slug, such as slug 700, shown in FIG. 7.

In lubricating step 606, slug 700 is lubricated in a tumbler. Lubrication allows the aluminum to flow properly during the subsequent forging process and assures the aluminum will be easy to remove from the forging equipment. Lubrication is usually applied to a batch of several hundred slugs in a tumbler. A dry waxy lubricant, usually having a graphite additive, is then added to the tumbler. Those having ordinary skill in the art are familiar with the selection of lubricants. The lubricated slugs are then transferred to a near-net shape cold forging press.

Figure 8:
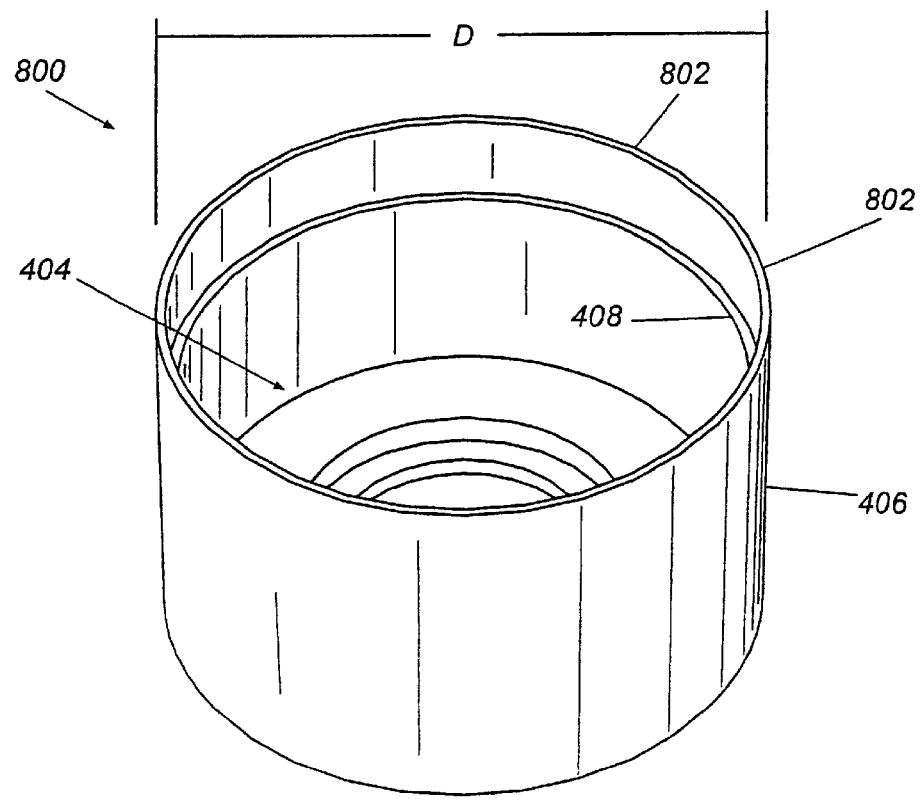
FIG. 8 is a front perspective view of the slug of FIG. 7 after the slug is cold forged.

In forging step 608, the lubricated slugs are near-net shape cold forged. Near-net shape cold forging is a pressing calculated to result in a form very similar to the final device form. Slug 700 is placed between two circular dies mounted in the forging press. The dies are mated. As the dies are pressed together, material is displaced axially and radially until the desired shape is formed. Near-net shape forging eliminates or greatly reduces machining requirements for the heat sink assembly 102 and allows for a high production rate. In addition, scrap is minimized. FIG. 8 is a front perspective view of slug 700 after slug 700 is subjected to the forging step 608. A near-net shape heat sink pre-assembly 800 is the result of near-net shape cold forging of lubricated slug 700.

The near-net shape heat sink pre-assembly 800 includes a lip 802 of excess material. The lip 802 and the bottom surface that becomes the heat conducting base portion 204 (not shown in FIG. 8) require additional machining as described below. However, the outer surface 406 of the peripheral annular wall portion 402, the inner surface 408 of the peripheral annular wall portion 402, and the surface of the chamber floor portion 404 do not require further machining after step 608.

Figure 9:
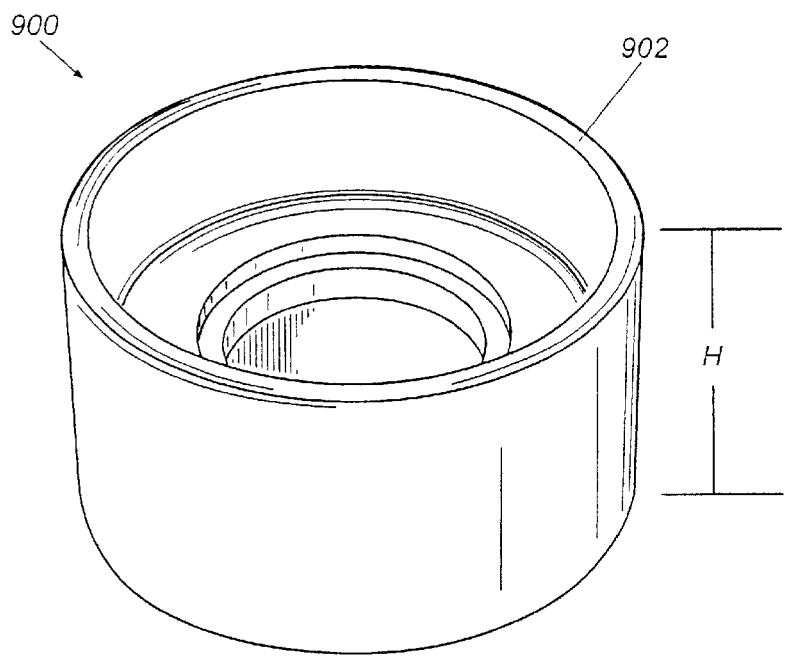
FIG. 9 is a front perspective view of a heat sink pre-assembly resulting from the forging and machining of the slug of FIG. 8.

In turning step 610, the precision surfaces, lower planar base surface 202 and the top of the peripheral annular wall portion 402, are machined, e.g. with a lathe. The lower planar base surface 202 is machined to assure the surface 202 is smooth and flat. In addition, the diameter of the heat conducting base portion 204 may be machined to assure a press fitting with an optional baseplate 1102. The lip 802 on the top of the peripheral annular wall portion 402 is machined to form a radius 902 and to remove excess metal and to assure there are no sharp edges. FIG. 9 is a front perspective view of the heat sink pre-assembly 900 of FIG. 8 after the heat sink assembly 800 is machined in step 610. FIG. 9 shows the radius 902 formed on the top of the peripheral annular wall portion 402.

Figure 10:
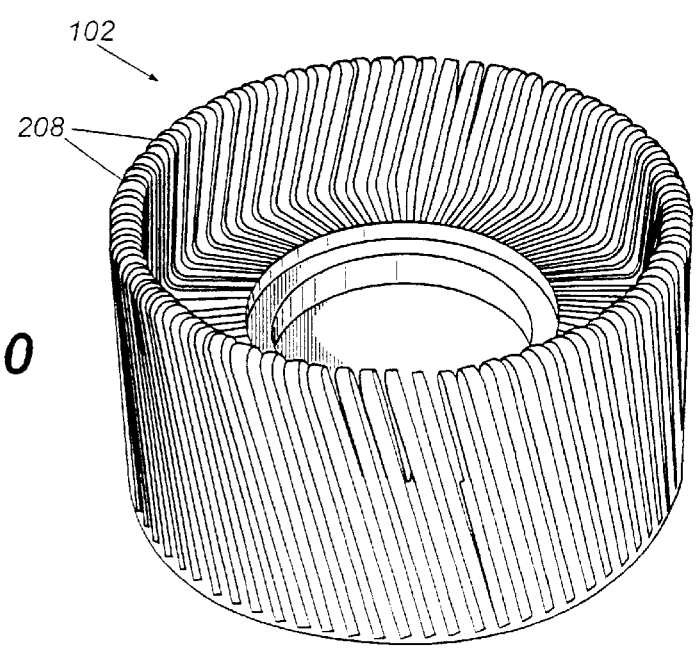
FIG. 10 is a front perspective view of the heat sink assembly after slot openings are cut into the heat sink pre-assembly of FIG. 9.

In second cutting step 612, the plurality of slot openings 206 and the plurality of cooling vanes 208 are created by machining the peripheral annular wall portion 402. The machining of the peripheral annular wall portion 402 may be done with a computer numerical control (CNC) saw. The heat sink pre-assembly 900 is cut with an automated circular saw to produce the plurality of cooling vanes 208, generally, by cutting multiple slot openings 206 simultaneously. Burrs produced during the sawing process are then sanded off. The result of second cutting step 612 is an uncleaned heat sink assembly 102. FIG. 10 is a front perspective view of the heat sink assembly 102 with slot openings 206 after the second cutting step 612.

Figure 11:
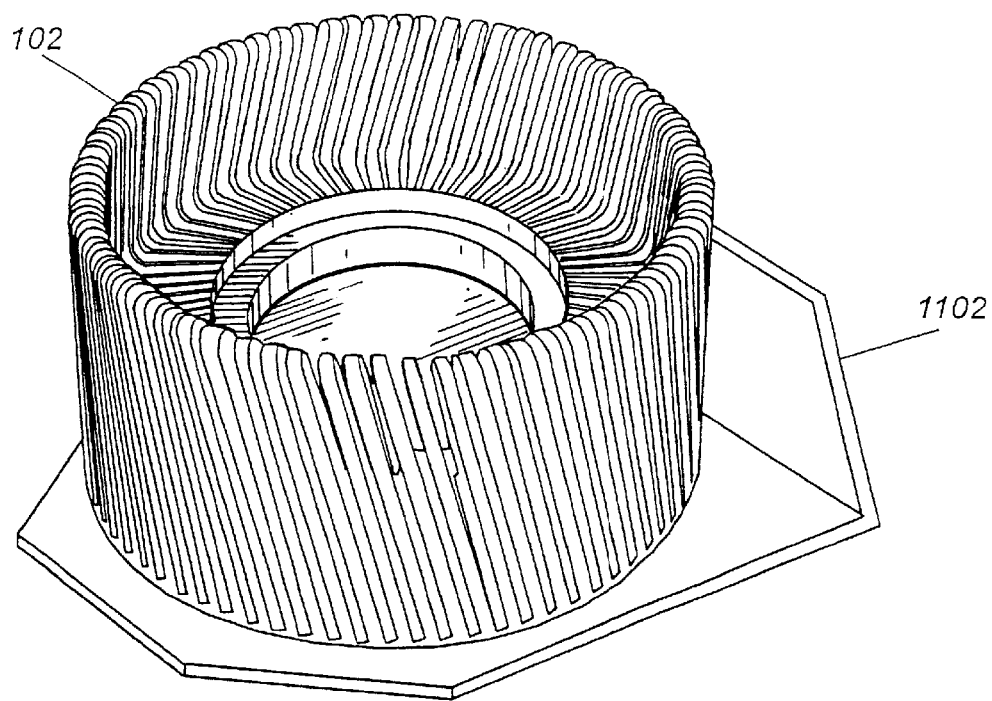
FIG. 11 is a front perspective view of the shape heat sink assembly of FIG. 10 with a clip pressed onto the base of the heat sink assembly.

In cleaning step 614, the heat sink assembly 102 is cleaned. On pressing step 616, the baseplate 1102, or clip, is pressed onto the heat sink assembly 104. FIG. 11 is a front perspective view of the heat sink assembly 102 with a clip pressed onto the heat conducting base portion 204.

Figure 12:
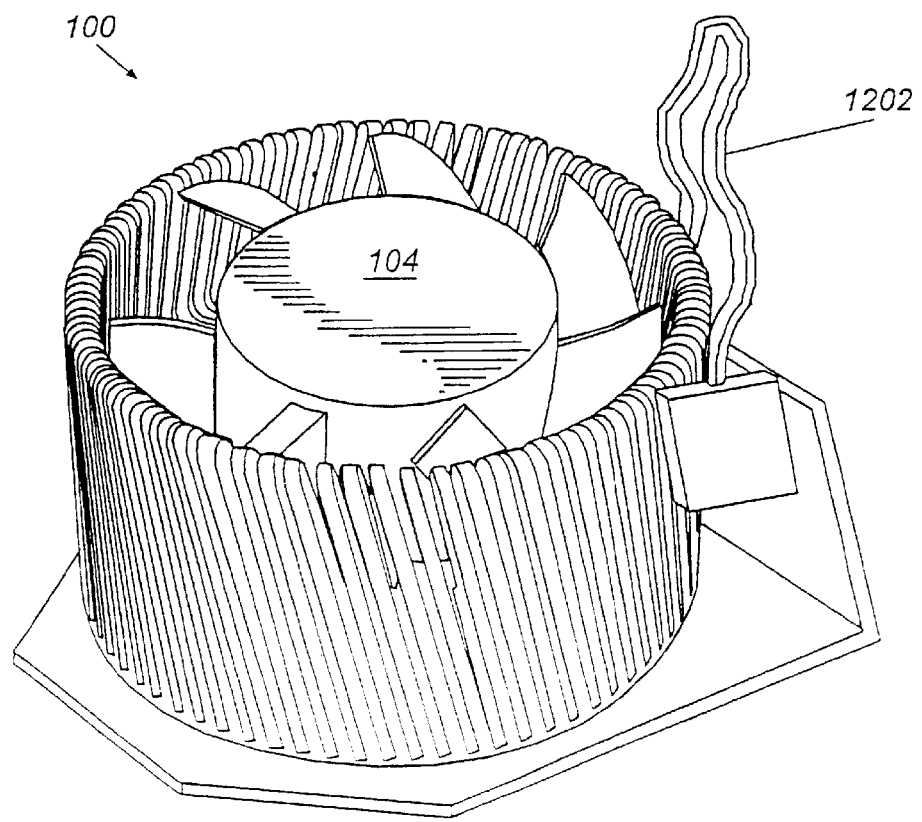
FIG. 12 is a front perspective view of the cooling device including the heat sink assembly of FIG. 11, a fan assembly, and electrical wires.

In pressing step 618, the fan assembly 104 is added and secured, generally with adhesive, electrical wires 1202 are placed in notch openings 424, and labels are added to the cooling device 100. The result of step 614 is a cooling device 100 as shown in FIG. 12. FIG. 12 is a front perspective view of the cooling device including the heat sink assembly 102, the fan assembly 108 and the electrical wires 1202.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method for manufacturing a cooling device, comprising the steps of:

(a) Pressing a slug to a near-net shape, wherein the near-net shape includes a peripheral wall portion defining a chamber, the chamber having a first open end and a second closed end, the closed end defined by a chamber floor portion, and wherein the near-net shape includes a heat conductive base portion, the heat conductive base portion being defined by a lower base surface and the chamber floor portion;

(b) machining the lower base surface;

(c) creating a radius on the top of the peripheral wall portion; and (d) cutting a plurality of slot openings in the peripheral wall portion.

2. The method of claim 1, wherein the plurality of slot openings extend through the peripheral wall portion, the slot openings also extending into the heat conductive base portion.

3. The method of claim 1, wherein the slug is an aluminum alloy.

4. The method of claim 1, wherein the slug has a diameter and the lower base surface has a diameter, and the slug diameter is less than the lower base surface diameter.

5. The method of claim 1, wherein the cooling device has a cooling device height measured in a direction substantially perpendicular to the lower base surface, wherein the heat conductive base portion has a base portion height measured as the minimum distance between the lower base surface and the chamber floor portion in a direction substantially perpendicular to the lower base surface, and wherein the heat conductive base portion height is at least 25% of the cooling device height.

6. The method of claim 1, further comprising the step of securing an air movement device to the chamber floor portion.

7. The method of claim 6, wherein the air movement device includes a fan.

8. The method of claim 1, wherein the peripheral wall portion is annular.

9. A method of claim 1, wherein the peripheral wall portion includes a plurality of slot openings.

10. The method of claim 1, wherein the peripheral wall portion includes a plurality of vanes.

11. The method of claim 1, further including:

cutting an extruded aluminum bar to a length less than the height of the peripheral wall portion to create the slug.

12. The method of claim 1, further including:

pressing a baseplate onto the heat conductive base portion.

* * * * *